United States Patent [19]
Nishihara

[11] Patent Number: 5,286,673
[45] Date of Patent: Feb. 15, 1994

[54] METHOD FOR FORMING POSITION ALIGNMENT MARKS IN A MANUFACTURING SOI DEVICE

[75] Inventor: Toshiyuki Nishihara, Kanagawa, Japan

[73] Assignee: Sony Corporation, Tokyo, Japan

[21] Appl. No.: 880,401

[22] Filed: May 8, 1992

[30] Foreign Application Priority Data

May 10, 1991 [JP] Japan ................... 3-105602

[51] Int. Cl.$^5$ ................ H01L 23/544; H01L 21/441
[52] U.S. Cl. .................. 437/187; 437/191; 437/228; 437/974
[58] Field of Search .......... 437/235, 974, 984, 187, 437/228, 191, 195

[56] References Cited

U.S. PATENT DOCUMENTS 4,309,813  1/1982  Hull .
4,468,857  9/1984  Christian et al. .
4,737,033  4/1988  Moldovan et al. .
5,183,783  2/1993  Ohta et al. ................ 437/974 X

FOREIGN PATENT DOCUMENTS 0179980  5/1986  European Pat. Off. .
0238694  9/1987  European Pat. Off. .

*Primary Examiner*—John S. Maples
*Attorney, Agent, or Firm*—Hill, Steadman & Simpson

[57] ABSTRACT

A position alignment mark is formed by simultaneously forming on a silicon substrate an alignment marking contact hole and a back surface electrode contact hole, respectively, in a field zone and an element zone. A wiring pattern layer and a back surface electrode are formed on the field zone and element zone, respectively. A silicon layer is cut from the back surface of the silicon substrate to expose the wiring pattern layer and an alignment marking contact hole pattern. The contact hole pattern is then used as an alignment mark for forming a surface electrode.

3 Claims, 5 Drawing Sheets

METHOD FOR FORMING POSITION ALIGNMENT MARKS IN A MANUFACTURING SOI DEVICE

BACKGROUND OF THE INVENTION

1. Field of the Invention

This invention relates to methods for forming position alignment marks, and in particular for position alignment mark formation which can be useful in the manufacture of sticked-layer structure SOI (silicon on insulating substrate) devices requiring their silicon layers and back surface electrodes to be laid over and stuck together as they are formed.

2. Description of the Prior Art

In particular,, sticked-layer structure SOI devices composed of single-crystal silicon having both of its surfaces stuck to electrodes have a decisive advantage in improving and raising to a great degree the circuit integration of their resultant semiconductor LSIs.

Among the drawings attached to this invention, FIGS. 1 and 2 and their associates are simplified cross-sectional views of an SOI device of the above-described type, which may make clear its conventionally-employed processing method step by step.

As shown in FIG. 1(a), an $SiO_2$ film on a silicon (Si) substrate is selectively etched to form a field zone (insulating zone) over the surface of the substrate 11 and is then subjected to thermal oxidation to form thereover a primary insulating layer 12 of oxidized silicon ($SiO_2(I)$). The silicon substrate thus processed is then, as shown in FIG. 1(b), masked over with a resist 17 and provided with a contact hole 20 which is cut therethrough to link the silicon layer with a back surface electrode layer. This contact hole 20 is positioned in an (active) element zone with its position aligned with respect to the end edge of the field zone.

As shown in FIG. 1(c), the silicon substrate is then stuck to polysilicon (poly-Si) which, through its patterning, forms the back surface electrode 13 in the contact hole 20.

As shown in FIG. 2(a) (just a reverse of its position as shown in FIG. 1(c)), the silicon substrate now has its entire surface covered over with a secondary insulating layer ($SiO_2$ film (II)) 14. In turn, this $SiO_2$ film (II) 14 is coated with a secondary poly-silicon (poly-si) layer which is a poly-Si layer 25. After having this layer polished, the silicon base is further stuck to a wafer 22 which forms a bed. The Si substrate 11 is ground and polished from the direction of its top surface (direction shown in the drawing with arrows) and its processing is completed when the $SiO_2$ film (I) 12 is exposed, leaving in its active zone the Si substrate 11 which is now an Si layer. As shown in FIG. 2(b), the Si substrate 11 thereafter has formed thereover a gate insulating film 21 and a poly-Si gate electrode (surface electrode) 16. In this processing, the poly-Si gate electrode has its position aligned with respect to the end edge of the field zone.

According to the conventional manufacturing process as just described in the above, the contact hole 20 as shown in FIG. 1(b) and the poly-Si gate electrode 16 as shown in FIG. 2(b) need to be aligned with each other across the field zone, inevitably necessitating their respective positions to be aligned separately and making their alignment difference vulnerable to increase accordingly. This, in turn, makes it necessary to keep twice as much as allowance for an alignment gap margin between the contact hole 20 and the poly-Si electrode 16 as shown in FIG. 2(b), a fact which hampers the desired high-level circuit integration of SOI devices in a method presented herein as a reference to the prior art in the field the present invention relates to.

OBJECT AND SUMMARY OF THE INVENTION

It is an object of the present invention to provide a position alignment method, in the manufacturing of SOI devices, which, making it possible to reduce the required position alignment gap allowance, can serve to realize the high-level circuit integration of such devices simply not made possible today by the conventional technology like one as just explained in the above.

According to one aspect of the present invention, there is provided a method for forming a position alignment mark comprising the steps of: simultaneously forming on a silicon substrate a alignment marking contact hole and a back surface electrode contact hole respectively in a field zone and an element zone; forming on said field and element zones a conduct pattern and a back surface electrode respectively; and cutting away a silicon layer from the back surface of said silicon substrate to expose a conduct pattern and an alignment marking contact hole pattern and then using said contact hole pattern as an alignment mark for forming a surface electrode.

According to another aspect of the present invention, there is provided a method for forming a position alignment mark comprising the steps of; a process to etch the surface of a silicon substrate to form a field zone; a process to form a primary insulating layer over the whole surface, and to form an alignment marking contact hole exposing said silicon substrate in said primary insulating layer of said field zone and a back surface electrode contact hole exposing said silicon substrate in said primary insulating layer of an element zone on said silicon substrate, respectively; a process to form over the whole surface a conductor layer and to perform patterning thereafter for forming in said alignment marking contact hole and in said back surface electrode contact hole a conductor pattern and a back surface electrode, respectively; and a process to cut away from the back surface of said silicon substrate a silicon layer, to expose the surface of said conductor pattern and an alignment marking contact hole pattern, and then to use said alignment marking contact hole pattern for forming a surface electrode.

According to further aspect of the present invention, there is provided a method for forming a position alignment mark comprising the steps of; a process to form on a silicon substrate a primary alignment marking hole in a field zone and a secondary back surface electrode contact hole in an element zone; a process to deposit the whole surface of said silicon substrate primary poly-Si by CVD (chemical vapor deposition); a process to etch said primary alignment marking hole while kept masked with a photoresist; a process to embed said secondary contact hole in a plug of a back surface electrode; a process to form over the whole surface of said silicon substrate secondary poly-Si and, to perform patterning thereof for forming a secondary poly-Si layer; and a process to stick to a wafer after the formation of a $SiO_2$ layer and said poly-Si layer; and a process to grind off said silicon substrate to expose an electrode which is provided to said alignment marking contact hole for forming a surface electrode.

PREFERABLE EMBODIMENTS OF THE INVENTION

First described herein below along with FIG. 3 and other drawings associated therewith is an SOI device embodying the present invention and its forming process.

Figure 1A:
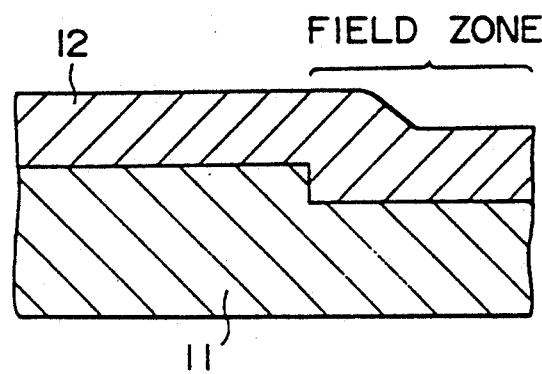
FIGS. 1(a) to 1(c) are cross-sectional views of a conventional SOI device, showing the first half of its processing steps.
Figure 1B:
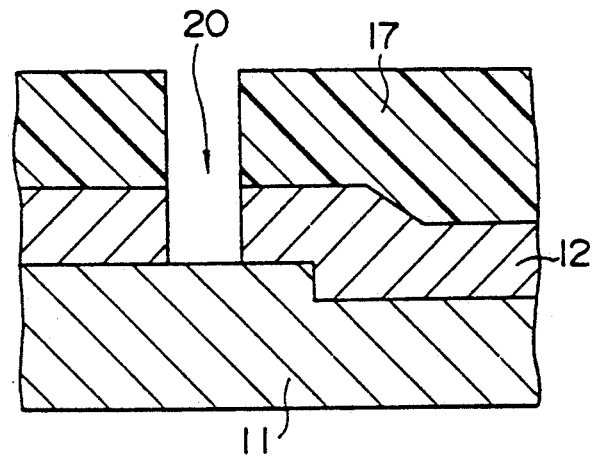
Figure 1C:
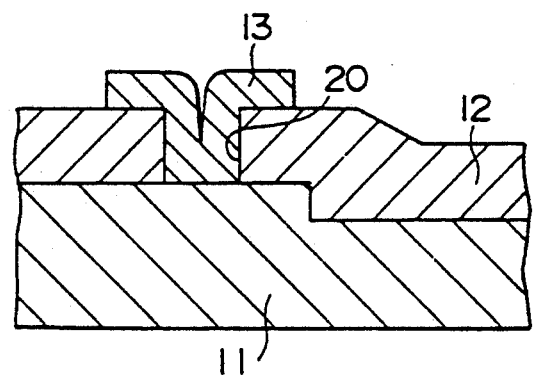
Figure 2A:
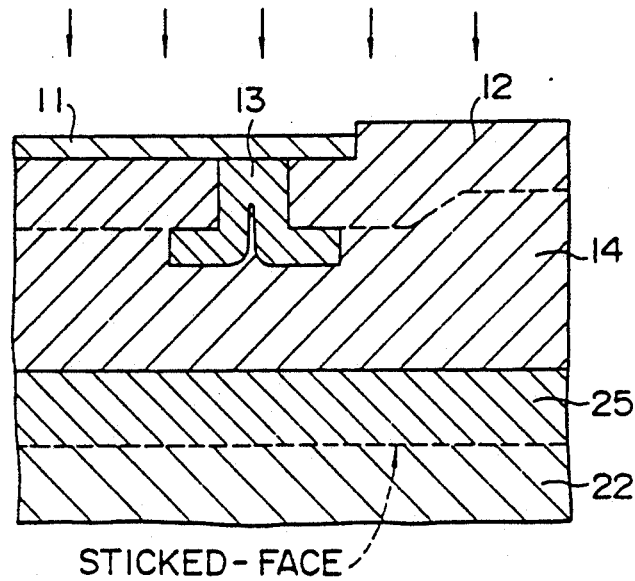
FIGS. 2(a) and 2(b) are similar cross-sectional views of the conventional SOI device, showing the last half of its processing steps.
Figure 2B:
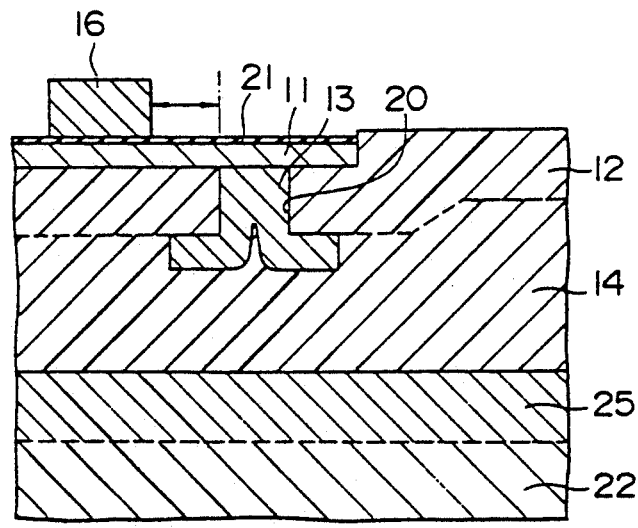
Figure 3A:
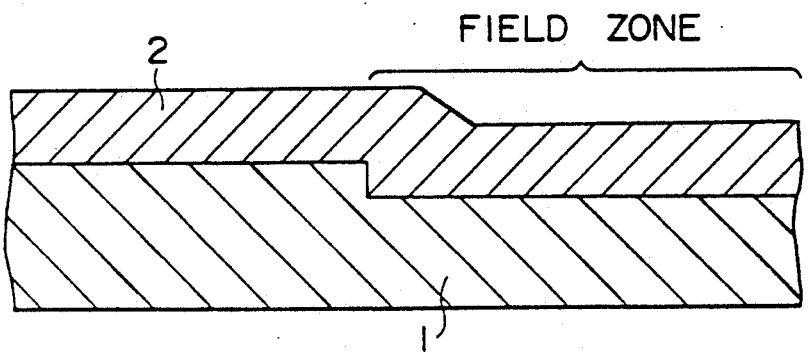
FIGS. 3(a) to 3(c) are cross-sectional views of an SOI device according to the present invention, showing the first half its processing steps.
Figure 3B:
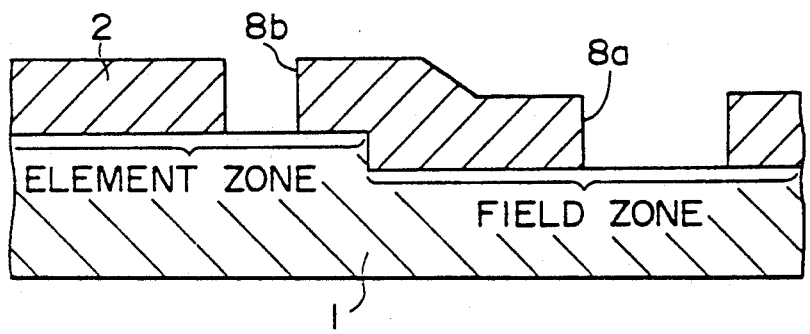

As shown in FIG. 3(a), an $SiO_2$ film on a Si substrate is selectively etched to form a field zone over the surface of the substrate 1, and is then subjected to thermal oxidation to form thereover a primary insulating layer Of $SiO_2$ film (I) having a thickness between 4,000 to 5,000Å. As also shown in FIG. 3(b), the field zone is over the $SiO_2$ film (I) 2, and a contact hole 8a marks its alignment. The $SiO_2$ film 2 further has, over an element zone (active zone) a contact hole 8b for a back surface electrode. The contact hole 8a for alignment marking, like the other hole 8b for the back surface electrode as just described in the above, passes through the field zone over the $SiO_2$ film (I) to reach the surface of silicon thereunder (Si substrate 1) with the corresponding part of the insulating layer etched out.

Figure 3C:
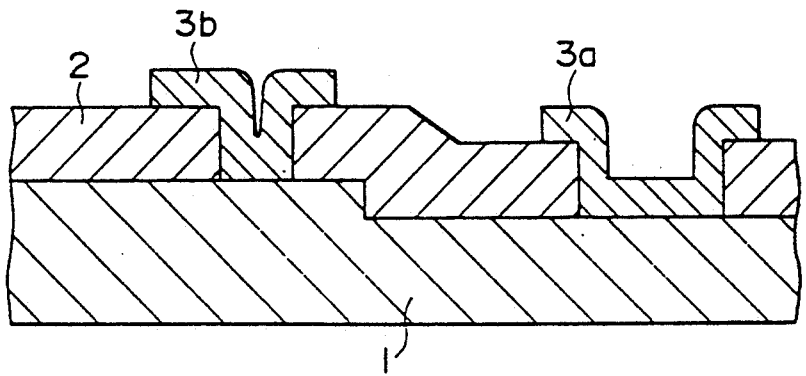

Then, as shown in FIG. 3(c), the poly-Si film as a conductive layer is deposited by CVD to a thickness between 1,000 to 2,000Å. Thus, deposited poly-Si as a conductive layer forms through its patterning an alignment marking electrode 3a and a back surface electrode 3b.

Figure 4A:
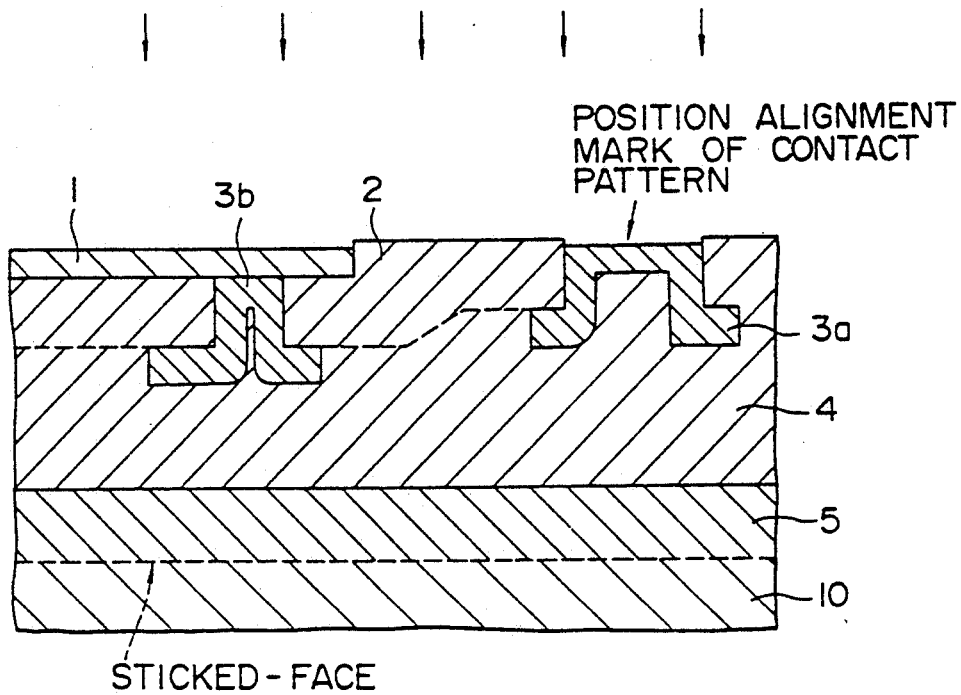
FIGS. 4(a) and 4(b) are cross-sectional views of the above SOI device according to the present invention, showing the last half of its processing steps.

As shown in FIG. 4(a) (just a reverse of its position as shown in FIG. 3(c)), the $SiO_2$ film (II) 4 as a secondary insulating layer is formed to a thickness between 5,000 to 6,000Å over the whole surface of the formed structure. Over the latter, a poly-Si film 5 is deposited by CVD to a thickness of about 4 μm. After having its surface (the bottom-up direction in the drawing) polished, a wafer as a bed is stuck to the structure to each other. The silicon base 1 is then ground from its back surface in a direction shown in the drawing with arrows (from top-down direction in the drawing) until it exposes the bottom of the alignment marking electrode 3a. Then, the latter is ground over its whole surface. All this now leaves the Si substrate 1 still keeping part of its Si layer in the element zone.

Figure 4B:
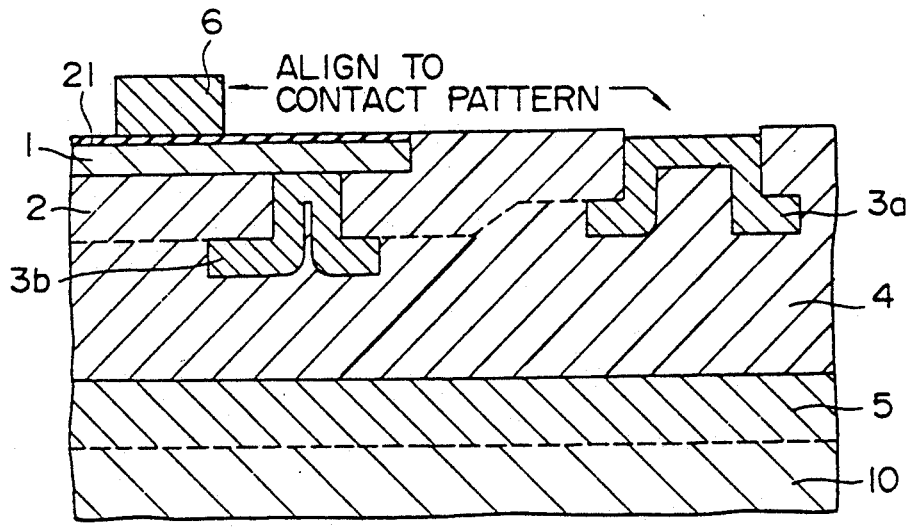

After a gate insulating layer 21 of $SiO_2$ is formed through thermal oxidation as shown in FIG. 4(b), a surface electrode 6 as a transistor gate made of poly-Si is laid thereover in alignment with the alignment mark of a contact pattern completed by then in the form of the alignment marking electrode 3a.

In the above-described embodiment of the present invention, the surface electrode 6 and the contact holes 8a and 8b as shown in FIG. 3(b) need only a single position alignment therebetween, thus making it only necessary to allow for a possible alignment difference between them.

Figure 5A:
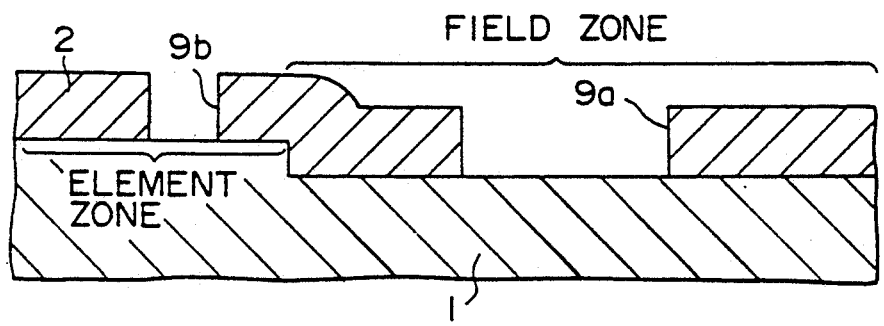
FIGS. 5(a) to 5(c) are cross-sectional views showing in its processing another preferable embodiment of the present invention.
Figure 5B:
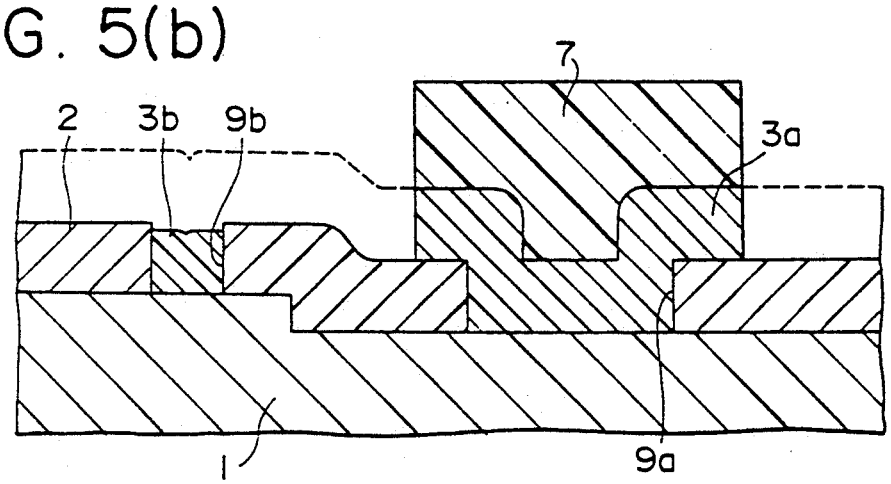
Figure 5C:
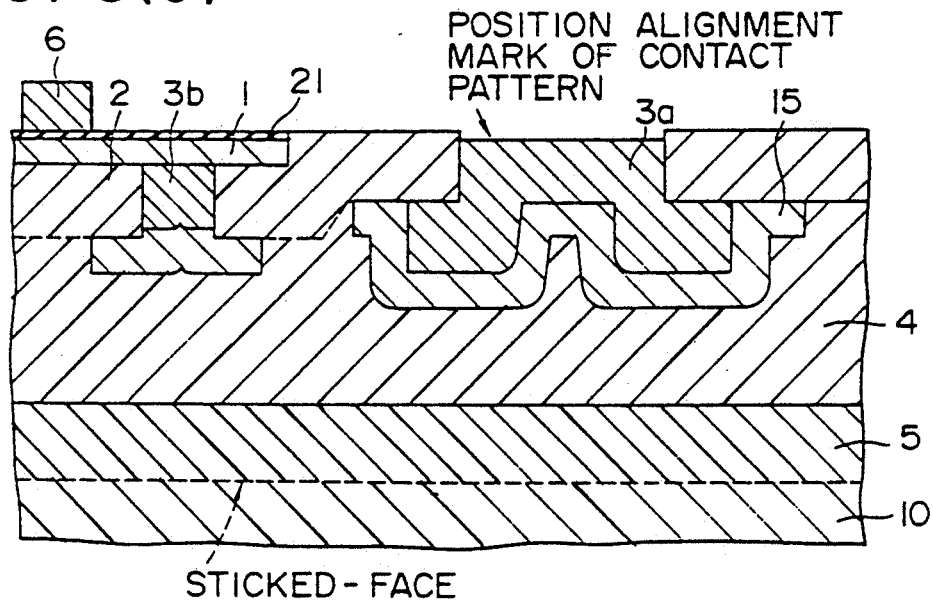

A second preferable embodiment of the present invention is now described along with FIGS. 5(a) to 5(c). FIG. 5(a) shows that, like in the first embodiment of the present invention the contact hole 9a for position alignment marking is formed in the field zone of the Si substrate and the back surface electrode contact hole 9b is formed in the element zone thereof. In the second embodiment, however, as shown in FIG. 5(a), the poly-Si for plugging is deposited over the whole surface of the Si substrate. Over this deposition through CVD, the alignment marking contact hole 9a is etched with the latter kept masked with the resist 7 and then the contact hole 9b is plugged off with the back surface electrode 3b. All this is designed to, in particular, prevent the resultant alignment marking from deformation.

As shown in FIG. 5(c), the Si substrate is again coated over its whole surface with poly-Si which, after its patterning, forms a secondary poly-Si film (II) 15. In the rest of its processing, the second embodiment has no difference with the first embodiment. Namely, like in the first embodiment, the $SiO_2$ film (II) and the poly-Si film 5 are then formed. After the wafer 10 is stuck to the structure, the Si base 1 is ground until it exposes the alignment marking electrode 3a to form thereon the surface electrode 6.

According to the present invention as just described in the above, it is possible, in the forming and processing of a sticked-layer structure SOI device, to align its electrodes and other constituents directly with its back-side contact pattern. This provides a way for the realization of a sophisticated SOI device with highly-advanced circuit integration not comparable to any which has ever been achieved before.

Making it possible to cut contact holes simultaneously through a surface field (insulating) zone and an element zone on its silicon base, the present invention allows the use of this field zone as the only alignment marking for the formation of its surface electrode and requires only a single alignment. It may be added that poly-silicon is the most recommendable material for SOI devices in any practical application of this invention.

It should, therefore, be understood that various changes and modifications to the presently preferred embodiments described herein will be apparent to those skilled in the art. Such changes and modifications can be made without departing from the spirit and scope of the present invention and without diminishing its attendant advantages. It is, therefore, intended that such changes and modifications be covered by the appended claims.

What is claimed is:

1. A method for forming a position alignment mark comprising the steps of:
   simultaneously forming on a silicon substrate an alignment marking contact hole and a back surface electrode contact hole, respectively, in a field zone and an element zone;
   forming on said field zone and said element zone a wiring pattern layer and a back surface electrode, respectively; and
   cutting a silicon layer from the back surface of said silicon substrate to expose the wiring pattern layer and an alignment marking contact hole pattern and then using said contact hole pattern as an alignment mark for forming a surface electrode.

2. A method for forming a position alignment mark comprising the steps of:

etching a surface of a silicon substrate to form a field zone;

forming a primary insulating layer over the surface, and forming an alignment marking contact hole exposing said silicon substrate in said primary insulating layer of said field zone and a back surface electrode contact hole exposing said silicon substrate in said primary insulating layer of an element zone on said silicon substrate, respectively;

forming over the surface a conductor layer and performing patterning thereafter for forming in said alignment marking contact hole and in said back surface electrode contact hole a conductor pattern and a back surface electrode, respectively; and cutting from the back surface of said silicon substrate a silicon layer, to expose the surface of said conductor pattern and an alignment marking contact hole pattern, and then using said alignment marking contact hole pattern for forming a surface electrode.

3. A method for forming a position alignment mark comprising the steps of:

forming on a silicon substrate a primary alignment marking hole in a field zone and a secondary back surface electrode contact hole in an element zone;

depositing primary poly-Si over said silicon substrate by chemical vapor deposition forming a primary poly-Si layer;

etching said primary alignment marking hole while masking with a photoresist;

embedding said secondary contact hole with a plug of a back surface electrode;

forming secondary poly-Si over said silicon substrate and performing patterning thereof for forming a secondary poly-Si layer; and sticking a wafer after the formation of a $SiO_2$ layer and a tertiary poly-Si layer to said tertiary poly-Si layer; and grinding said silicon substrate to expose an electrode which is provided to said alignment marking contact hole for forming a surface electrode.

* * * * *